United States Patent [19]

Iwai

[11] Patent Number: 4,597,166

[45] Date of Patent: Jul. 1, 1986

[54] SEMICONDUCTOR SUBSTRATE AND METHOD FOR MANUFACTURING SEMICONDUCTOR DEVICE USING THE SAME

[75] Inventor: Hiroshi Iwai, Tokyo, Japan

[73] Assignee: Tokyo Shibaura Denki Kabushiki Kaisha, Kawasaki, Japan

[21] Appl. No.: 464,922

[22] Filed: Feb. 8, 1983

[30] Foreign Application Priority Data

Feb. 10, 1982 [JP] Japan .................................. 57-20117

[51] Int. Cl.[4] ................... H01L 21/322; H01L 21/461
[52] U.S. Cl. ..................................... 29/580; 29/576 T; 148/1.5; 148/33.2; 148/DIG. 60; 148/DIG. 66
[58] Field of Search ...................... 29/576 T, 580, 583; 148/1.5, 33.2, 191, DIG. 60, DIG. 66; 156/662; 357/55

[56] References Cited

U.S. PATENT DOCUMENTS

| | | | |
|---|---|---|---|
| 3,757,414 | 9/1973 | Keller | 29/580 |
| 3,767,494 | 10/1973 | Muraoka | 29/580 |
| 4,144,099 | 3/1979 | Edmonds et al. | 148/DIG. 60 |
| 4,191,788 | 3/1980 | Harrington | 148/33.2 |
| 4,372,803 | 2/1983 | Gigante | 156/662 |
| 4,400,869 | 8/1983 | Wilner et al. | 29/580 |

OTHER PUBLICATIONS

Nagasaki et al., "Gettering Technique and Structure", IBM Technical Disclosure Bulletin, vol. 17, No. 12, May 75.

Miersch, "Natural LSI Process Step to Create Controllable Boiling Centers," IBM Technical Disclosure Bulletin, vol. 18, No. 2, Jul. 1975.

Mets, Poisoning and Gettering Effects in Silicon Junctions," Journal of the Electrochemical Society, Apr., 1965.

Primary Examiner—Brian E. Hearn
Assistant Examiner—Hunter L. Auyang
Attorney, Agent, or Firm—Finnegan, Henderson, Farabow, Garrett & Dunner

[57] ABSTRACT

A semiconductor substrate has a semiconductor substrate main body having a first major surface and a second major surface opposite thereto. At least one recess is formed in the second major surface. The recess defines a semiconductor element formation region between a bottom surface thereof and the first major surface of the substrate main body. Gettering of contaminant impurities such as heavy metals can be effectively performed at the rear surface of the substrate after the formation of a semiconductor element in the element formation region.

16 Claims, 10 Drawing Figures

SEMICONDUCTOR SUBSTRATE AND METHOD FOR MANUFACTURING SEMICONDUCTOR DEVICE USING THE SAME

BACKGROUND OF THE INVENTION

I. Field of the Invention

The present invention relates to an improvement in a semiconductor substrate, and a method for manufacturing a semiconductor device using such an improved semiconductor substrate.

II. Description of the Prior Art

In the manufacture of LSIs, and particularly MOSLSIs, cost is an important problem. With increasing demands for lower manufacturing costs, semiconductor substrates (wafers) for LSIs tend to have larger diameters. If a wafer has a larger diameter, a greater number of LSI chips may be formed, resulting in improved mass-production and lower manufacturing costs for semiconductor devices.

However, when the diameter of a wafer is increased but the thickness remains the same, the mechanical strength of the wafer is degraded to cause warpage or deformation during annealing. Therefore, the thickness of the wafer must be increased together with an increase in the diameter. For example, a wafer having a diameter of 2 inches has a thickness of 200 to 300 $\mu$m; a wafer having a diameter of 3 inches has a thickness of 350 to 450 $\mu$m; a wafer having a diameter of 4 inches has a thickness of 500 to 600 $\mu$m; and so on.

When the thickness of the wafer is increased, however, the following problems are encountered:

(1) When the thickness is increased, the wafer can withstand annealing without suffering warpage or the like, but the wafer is then subject to a greater stress, resulting in defects.

(2) After forming a plurality of LSI chips on a wafer, the wafer is made thinner by lapping or the like, and a metal such as Au is deposited on its rear surface to decrease its resistance. If the thickness after lapping is great, the resistance cannot be sufficiently decreased. On the other hand, if lapping is performed to make a thick and large diameter wafer sufficiently thin, the wafer may crack during lapping.

(3) If the wafer is thick, it is also heavy. Then, when it is placed in a rotator for drying, the centrifugal force on the wafer is increased and the wafer may not be stably supported.

An increased wafer thickness not only affects the wafer but also the manufacturing steps of, for example, MOS transistors as will be described below.

FIG. 1 is a sectional view of a MOS transistor in an intermediate manufacturing step (after forming contact holes and before phosphorus gettering). The MOS transistor has a silicon semiconductor substrate (wafer) 1 of p-conductivity type. N+-type source and drain regions 5 and 6 are electrically isolated from each other and are formed in an island region isolated by a field oxide film 2 formed on the wafer 1. A gate electrode 3 of polycrystalline silicon is formed through a gate oxide film 4 on a surface portion of the wafer 1 between the source and drain regions 5 and 6. An interlayer insulating film 7 such as a CVD-SiO$_2$ film is formed on the entire surface of the substrate 1 including the surface of the gate electrode 3. Contact holes 8 are formed in the portions of the interlayer insulating film 7 corresponding to the source and drain regions 5 and 6. After obtaining the structure as described above, gettering using phosphorus (hereinafter referred to as "phosphorus gettering") is performed from a rear surface 1a of the wafer and an aluminum wiring is formed, thus completing the main steps for manufacturing MOSLSI's. In the step of phosphorus gettering, heavy metals present in the MOS transistor region are gettered. If the heavy metal is present in the element formation region, problems occur such as an increase in the leakage voltage at a p-n junction, a short life of minority carriers which causes disappearance of a charge stored on an MOS capacitor within a short period of time, and the like.

In the step of phosphorus gettering, phosphorus is diffused into the rear surface of a wafer in a high-temperature atmosphere containing oxygen, so as to form a phosphosilicate glass (PSG) film. During annealing such as the thermal diffusion of the phosphorus, the heavy metal or the like diffused from the element region is fixed in the PSG film, thus removing the heavy metal from the element formation region. However, with an increase in the thickness of the wafer, the time required for the heavy metal to migrate from the element formation region to the rear surface of the wafer is increased, and the efficiency of phosphorus gettering is degraded. Similar problems are encountered when defects are deliberately formed in the rear surface of the wafer, and the contaminant impurities are removed by being trapped by the defects upon annealing. The decrease in the efficiency of gettering is more pronounced when the gettering step is performed at a lower temperature.

SUMMARY OF THE INVENTION

It is an object of the present invention to provide a semiconductor substrate which includes in particular both a wafer of a large diameter and a substrate cut therefrom, which will not warp and which can achieve a low resistance and high gettering efficiency.

It is still another object of the present invention to provide a method for manufacturing a semiconductor device using a semiconductor substrate as described above.

In accordance with an aspect of the present invention, the above object is achieved by a semiconductor substrate comprising a semiconductor substrate main body having a first major surface and a second major surface opposite thereto; and at least one recess formed in said second major surface so as to define a semiconductor element formation region between a bottom surface of said recess and said first major surface.

A method for manufacturing a semiconductor device is also within the scope of the present invention, according to which a semiconductor element such as an MOS transistor is formed on a surface area of the element formation region of the semiconductor substrate of the invention described above, and gettering or formation of a metal layer is performed at the second major surface of the semiconductor substrate.

The present invention is particularly suitable for large diameter semiconductor wafers such as wafers having diameters of 3 inches (7.62 cm), 4 inches (10.16 cm) or more. The thickness of such wafers is 350 to 450 $\mu$m, 500 to 600 $\mu$m or more respectively.

When gettering is performed, in an atmosphere containing oxygen and maintained at a high temperature (e.g., 800° to 1,000° C.) phosphorus is diffused into the surface (including the second surface and the side and bottom surfaces of the recess) of the semiconductor substrate. A phosphosilicate glass (PSG) film is thus formed, and heavy metals diffused from the element formation region by heat during the phosphorus diffusion is fixed in the PSG film. Alternatively, gettering may be performed by forming defects in the rear surface of the semiconductor substrate and gettering a heavy metal in the defects by annealing.

DETAILED DESCRIPTION OF THE PREFERRED EMBODIMENTS

Figure 1:
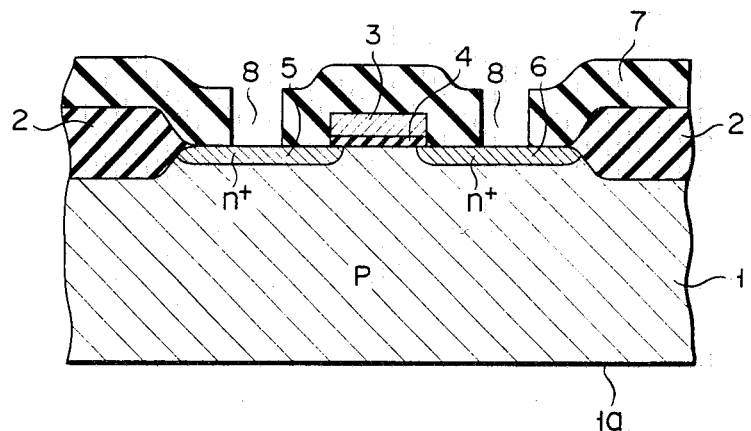
FIG. 1 is a sectional view of an MOS transistor formed on a conventional semiconductor substrate during an intermediate manufacturing step.

The present invention will now be described in more detail with reference to the accompanying drawings. The same reference numerals denote the same parts throughout these drawings.

Figure 2A:
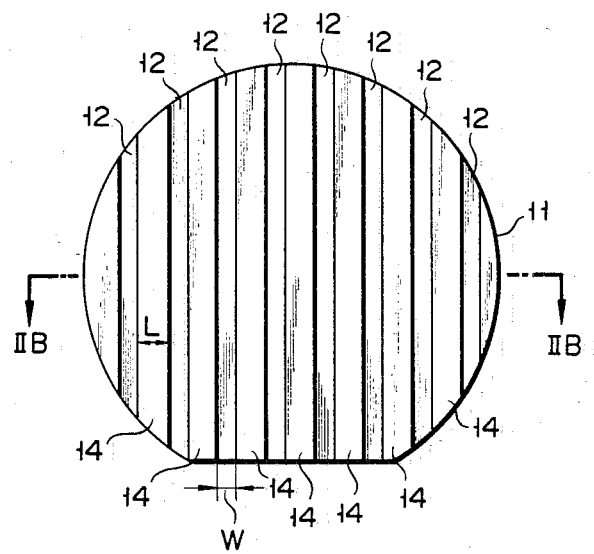
FIG. 2A is a plan view showing the rear surface of a semiconductor wafer according to an embodiment of the present invention.
Figure 2B:
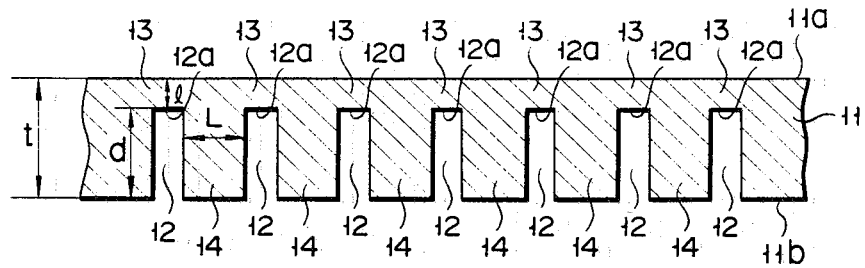
FIG. 2B is an enlarged, partial sectional view along the line IIB—IIB in FIG. 2A.

Referring to FIGS. 2A and 2B, a semiconductor substrate, in this case, a silicon wafer 11 having a diameter of 4 inches and a thickness t of 600 $\mu$m, has a first major surface 11a and a second major surface 11b on the opposite side. A plurality of elongated recesses or grooves 12 each having a width W of, e.g., several tens to several hundreds $\mu$m are formed parallel to each other in the second major surface 11b. In the example shown in the figure, each groove 12 is a right-angled groove having a depth of 150 $\mu$m or more.

A semiconductor element formation region 13 is defined between a bottom surface 12a of each groove 12 and a corresponding surface 11a of the wafer.

Since a plurality of grooves 12 are formed in the wafer of the present invention, stress which may act on the wafer during annealing in the manufacturing process of the semiconductor device may be reduced to the minimum by the grooves 12. Accordingly, the formation of defects in the wafer 11 is prevented. Furthermore, since the grooves 12 are formed in the wafer 11, the wafer may be made lighter in weight. The procedure for placing the wafer 11 in the rotator of a drier and for drying with a centrifugal force may be simplified.

Figure 3:
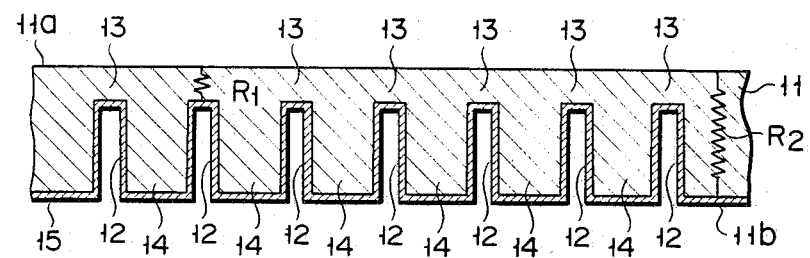
FIG. 3 is a sectional view, as in FIG. 2B, of a wafer on the rear surface of which a gold layer is formed.

When an Au layer 15 is deposited on the rear surface of the wafer 11, as shown in FIG. 3, to decrease the resistance in the direction of the thickness of the wafer 11, the resistance between the surface 11a at the element formation region 13 and the Au layer 15 is a resistance $R_1$ between the bottom surface of the groove 12 and the surface 11a, as shown in the figure. In contrast to this, when the Au layer 15 is deposited on the rear surface of a wafer 11 with no grooves, the resistance between the surface 11a of the wafer 11 and the Au layer 15 is a resistance $R_2$ between the surface 11a and the Au layer 15, as shown in FIG. 3. As may be seen from this, the resistance at the element formation region in the direction of the thickness thereof can be reduced in the wafer 11 of the present invention which has grooves 12 in its second major surface 11b.

A ridge 14 formed between each pair of adjacent grooves 12 serves to strengthen the wafer 11 having the grooves 12.

Distance L from the edge of the opening of the groove 12 to that of the immediately adjacent groove 12, that is, the width L of the ridge 14 in FIGS. 2A and 2B, is preferably twice or less the distance between the bottom surface 12a of the groove 12 and the surface 11a of the wafer 11, that is, the thickness l of the element formation region 13, for the purpose of reducing the resistance and increasing gettering efficiency.

In view of gettering efficiency at 1,000° C., the distance l is preferably less than 1 mm. However, for gettering at a lower temperature, the distance l is preferably less than several hundreds $\mu$m. Specifically the distance l is most preferably 100 $\mu$m to 500 $\mu$m, although it varies according to the desired resistivity and/or getting time or temperature. Therefore, each of the recesses such as the grooves 12 preferably has depth d which is at least 10% or more of the thickness t of the wafer.

Figure 4A:
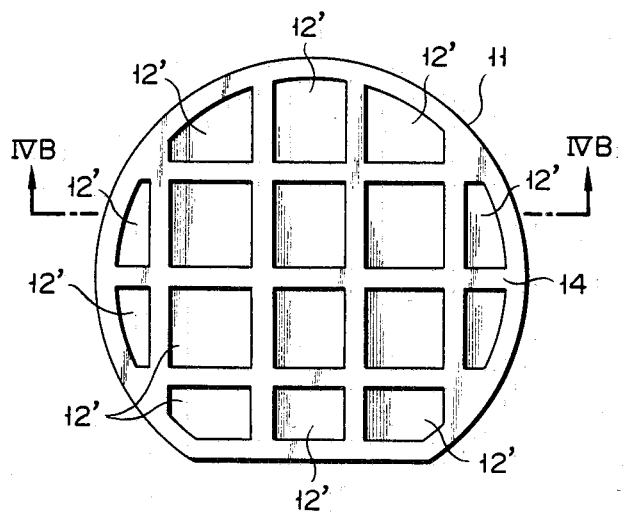
FIG. 4A is a plan view showing the rear surface of a semiconductor wafer according to another embodiment of the present invention.
Figure 4B:
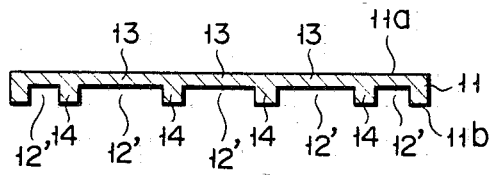
FIG. 4B is a sectional view along the line IVB—IVB in FIG. 4A.
Figure 5:
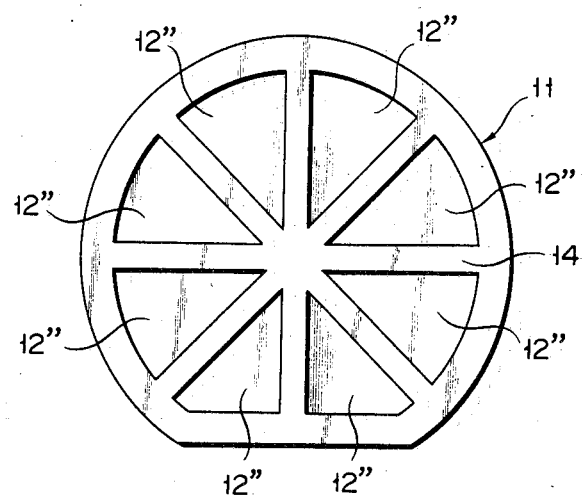
FIGS. 5 and 6 are plan views showing the rear surfaces of semiconductor wafers according to still other embodiments of the present invention.
Figure 6:
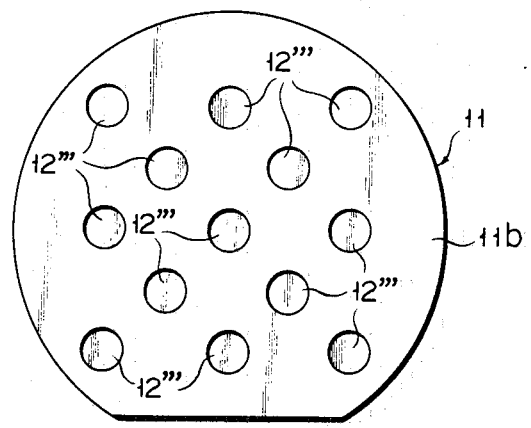

In FIGS. 2A and 2B, the recesses formed in the surface 11b of the wafer 11 are grooves. However, the shape of the recesses is not limited to this. FIGS. 4A and 4B show another embodiment of the present invention wherein a plurality of square-shaped recesses 12' are formed in a surface 11b of a wafer 11, and ridges 14 are formed in a lattice shape and around the perimeter of the wafer 11. FIG. 5 shows a plurality of fan-shaped recesses 12" according to still another embodiment of the present invention. In this case, ridges 14 are formed radially and around the perimeter of a wafer 11. FIG. 6 shows still another embodiment of the present invention wherein a plurality of circular recesses 12''' are formed in a surface 11b of a wafer 11.

Figure 7:
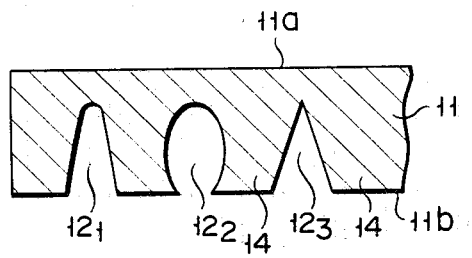
FIG. 7 is a sectional view showing a semiconductor wafer according to still another embodiment of the present invention.

When each recess is a groove, the sectional shape of it need not be a rectangular as shown in FIGS. 2A and 2B. FIG. 7 shows a wafer 11 with grooves $12_1$, $12_2$ and $12_3$ of various sectional shapes according to still another embodiment of the present invention.

The method of the present invention will now be described.

EXAMPLE 1

After forming grooves 12 in a wafer 11 and semiconductor elements (not shown) in the surfaces of element formation regions 13 as shown in FIG. 2, phosphorus gettering was performed from the rear surface of the wafer 11.

Since in each groove 12 the elements on the surface 11a and the rear surface of the wafer 11 became close to each other, the effect of phosphorus gettering was improved significantly. A semiconductor device obtained from such a wafer 11 will give improved performance and has a very small numbers of defects. Similar effects may also be obtained by forming defects in the rear surface of the wafer 11 and performing gettering thereafter.

EXAMPLE 2

Figure 8:
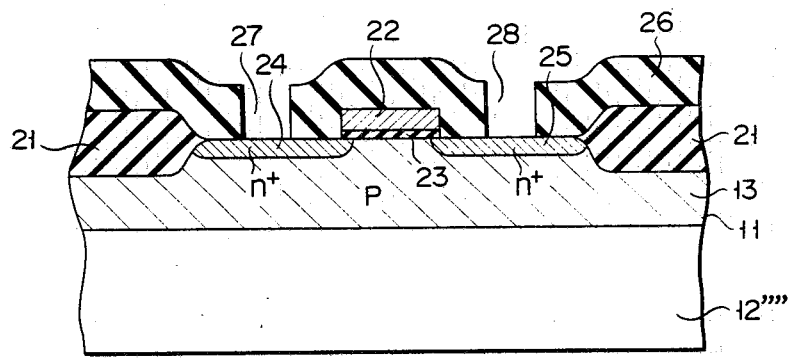
FIG. 8 is a sectional view for explaining the method for manufacturing a semiconductor device according to the present invention.

As shown in FIG. 8, after selectively forming a field oxide film 21 for element isolation on a p-type silicon wafer 11, thermal oxidation was performed to grow an oxide film on an element formation region 13 of a wafer 11. A phosphorus-doped polycrystalline silicon film was formed thereover. The polycrystalline silicon film was patterned to form a gate electrode 22. Using the gate electrode 22 as a mask, the thermal oxide film was selectively etched to form a gate oxide film 23. Using the gate electrode 22 and the field oxide film 21 as a mask, the structure was implanted with phosphorus ions (n-type impurity). The implanted phosphorus ions were activated to form n+-type source and drain regions 24 and 25 in the element formation region 13 of the p-type silicon wafer 11. After forming an SiO$_2$ film 26 by the CVD process, it was etched by photoetching to form contact holes 27 and 28 at positions of the SiO$_2$ film 26 corresponding to the source and drain regions 24 and 25. After forming a groove 12'''' on the rear surface of the wafer 11 along the direction of the channel of the MOS transistor formed on the wafer 11, phosphorus gettering was performed from the rear surface of the wafer 11.

The phosphorus gettering could be effectively performed in the element regions such as source and drain regions 24 and 25, and good electrical characteristics were obtained from the resulting MOSLSI.

The method of the present invention is not limited to the manufacture of MOSLSIs and may be similarly applied to bipolar LSIs or the like. Cutting of chips from a wafer is performed at the ridges.

In summary, the present invention can provide a semiconductor substrate which does not produce warpage and which can achieve a lighter weight, a smaller resistance and the like, and also a method for manufacturing a semiconductor device which has excellent element characteristics owing to improved gettering effects.

What is claimed is:

1. A method for manufacturing a semiconductor device, comprising:
   (a) providing a semiconductor substrate main body having a first major surface and a second major surface opposite thereto;
   (b) forming a plurality of recesses in said second major surface, thereby defining a semiconductor element formation region between a bottom surface of a recess and said first major surface;
   (c) forming a semiconductor element in said semiconductor element formation region; and
   (d) subjecting said semiconductor substrate main body to a gettering treatment from said second major surface.

2. A method according to claim 1, wherein said semiconductor substrate main body comprises a wafer having a diameter of 3 inches or more and a thickness of 300 μm.

3. A method according to claim 1 or 2, wherein a distance between the bottom surface of said recess and the first major surface of said substrate is less than several hundreds micrometers.

4. A method according to claim 1 or 2, wherein said recess has a depth corresponding to not less than 10% of the thickness of said semiconductor substrate main body.

5. A method according to claim 4, wherein said recess comprises a groove.

6. A method according to claim 5, wherein a width of a ridge formed between each adjacent pair of said grooves is not more than twice a thickness of said semiconductor element formation region.

7. A method according to claim 4, wherein ridges formed between each adjacent pair of said recesses are formed in a lattice-shape.

8. A method according to claim 4, wherein a ridge formed between each adjacent pair of said recesses is formed radially from a center of said wafer.

9. A method according to claim 1 or 2, wherein said recess has a depth of not less than 150 μm.

10. A method according to claim 9, wherein said recess comprises a groove.

11. A method according to claim 10, wherein a width of a ridge formed between each adjacent pair of said grooves is not more than twice a thickness of said element formation region.

12. A method according to claim 9, wherein ridges formed between each adjacent pair of said recesses are formed in a lattice-shape.

13. A method according to claim 9, wherein a ridge formed between each adjacent pair of said recesses is formed radially from a center of said wafer.

14. A method according to claim 1, wherein step (c) is performed after step (b).

15. A method according to claim 1, wherein step (b) is performed after step (c).

16. A method according to claim 1 wherein said semiconductor substrate main body is subjected to a phosphorus gettering treatment from said second major surface.

* * * * *